US012305928B2

(12) United States Patent
Wei et al.

(10) Patent No.: US 12,305,928 B2
(45) Date of Patent: May 20, 2025

(54) COMPOSITE VC HEAT SINK CONTAINING COPPER/DIAMOND COMPOSITE WICK STRUCTURE AND METHOD FOR PREPARING SAME (71) Applicant: CENTRAL SOUTH UNIVERSITY, Changsha (CN)

(72) Inventors: Qiuping Wei, Changsha (CN); Kechao Zhou, Changsha (CN); Li Ma, Changsha (CN); Xi Wang, Changsha (CN)

(73) Assignee: CENTRAL SOUTH UNIVERSITY, Changsha (CN)

( * ) Notice: Subject to any disclaimer, the term of this patent is extended or adjusted under 35 U.S.C. 154(b) by 340 days.

(21) Appl. No.: 17/887,412

(22) Filed: Aug. 12, 2022

(65) Prior Publication Data
US 2023/0052246 A1 Feb. 16, 2023

(30) Foreign Application Priority Data
Aug. 13, 2021 (CN) .......................... 202110928597.6

(51) Int. Cl.
*F28D 15/04* (2006.01)
*B22F 7/06* (2006.01)
(Continued)

(52) U.S. Cl.
CPC ............ *F28D 15/046* (2013.01); *B22F 7/064* (2013.01); *F28F 21/04* (2013.01); *F28F 21/085* (2013.01);
(Continued)

(58) Field of Classification Search
CPC .................. B22F 7/064; B22F 2301/10; B22F 2302/406; H05K 7/20336; C22C 26/00;
(Continued)

(56) References Cited

U.S. PATENT DOCUMENTS 11,035,622 B1 * 6/2021 Strehlow ............. F28D 15/0233
2004/0175875 A1 * 9/2004 Sung .................... H01L 23/3732
257/E23.11

(Continued)

FOREIGN PATENT DOCUMENTS

CN 104517909 A 4/2015
CN 111465293 A * 7/2020
(Continued)

*Primary Examiner* — Tho V Duong
(74) *Attorney, Agent, or Firm* — Bayramoglu Law Offices LLC (57) ABSTRACT A composite VC heat sink containing a copper/diamond composite wick structure and a method for preparing the same are provided. The VC heat sink includes a lower shell plate. The lower shell plate is provided with a recess at a center position of an inner surface and provided with a boss with a same plane size as the recess at a center position of an outer surface, and a surface of the boss or a surface of the recess is provided with a copper/diamond composite plate. The copper/diamond composite wick structure has a three-dimensional porous structure and uses a copper/diamond sintered body as a matrix, a surface of the matrix is provided with a diamond layer, and a surface of the diamond layer is provided with a metal hydrophilic layer. The heat dissipation performance of the composite VC heat sink is maximized under the cooperation of structure and materials.

10 Claims, 2 Drawing Sheets (51) Int. Cl.
  *F28F 21/04* (2006.01)
  *F28F 21/08* (2006.01)
(52) U.S. Cl.
  CPC ....... *B22F 2201/20* (2013.01); *B22F 2301/10* (2013.01); *B22F 2302/406* (2013.01); *F28F 2255/06* (2013.01); *F28F 2255/18* (2013.01)
(58) Field of Classification Search
  CPC ...... F28F 21/04; F28F 21/085; F28F 2255/06; F28F 2255/18; H01L 23/3732; H01L 23/3733; H01L 23/427
  USPC .................................................. 165/104.26
  See application file for complete search history.

(56) References Cited

U.S. PATENT DOCUMENTS

| | | | |
|---|---|---|---|
| 2007/0102070 A1* | 5/2007 | Tuma | C23C 26/00 |
| | | | 148/512 |
| 2007/0256810 A1 | 11/2007 | Di Stefano et al. | |
| 2009/0269521 A1* | 10/2009 | Tuma | C23C 26/02 |
| | | | 427/383.1 |
| 2011/0083835 A1* | 4/2011 | Chen | H01L 23/373 |
| | | | 165/185 |
| 2018/0128553 A1 | 5/2018 | Lewis et al. | |

FOREIGN PATENT DOCUMENTS

| | | | | |
|---|---|---|---|---|
| CN | 111676385 A | 9/2020 | | |
| CN | 211823993 U | 10/2020 | | |
| CN | 112944965 A | 6/2021 | | |
| CN | 113210611 A | 8/2021 | | |
| JP | 2005300038 A | * 10/2005 | ......... | F28D 15/0266 |

* cited by examiner

COMPOSITE VC HEAT SINK CONTAINING COPPER/DIAMOND COMPOSITE WICK STRUCTURE AND METHOD FOR PREPARING SAME

CROSS REFERENCE TO THE RELATED APPLICATIONS

This application is based upon and claims priority to Chinese Patent Application No. 202110928597.6, filed on Aug. 13, 2021, the entire contents of which are incorporated herein by reference.

TECHNICAL FIELD

The present invention discloses a composite VC heat sink containing a copper/diamond composite wick structure, belonging to the technical field of thermal management equipment.

BACKGROUND

With the advent of the 5G era, in order to meet the growing needs for use, all kinds of electronic devices have been updated and developed towards miniaturization, high integration and high performance. However, with the requirements for the rapidly increasing working power and increasingly smaller volume, the power density of the electronic component increases sharply. The electronic components working in such a small area with high power are bound to generate tremendous heat. When the heat cannot be dissipated in time, it will lead to failure, damage, and even meltdown of the electronic devices. The heat dissipation of high-power electronic devices has become a bottleneck for the application of new-generation electronic devices.

As a heat sink device that efficiently transfers heat from the hot side to the cold side by utilizing gas-liquid phase changes, the VC plate benefits from its excellent temperature uniformity and high heat dissipation efficiency, and as compared with the traditional heat pipe, its two-dimensional planar heat transfer characteristics brought by its flat structure makes it more suitable for heat dissipation of chips. At present, the flat heat pipe has been widely used in LED, CPU, and electronic communication equipment, and it is further replacing the traditional round heat pipe. In future, it will have broad prospects in the application of laser weapons and high-power components for defense industry.

As the core component of the VC plate, capillary wicks are mostly copper-based at present, but due to the low thermal conductivity of copper itself, it is difficult to meet the needs of heat dissipation for higher power in future. As the material with the best thermal conductivity in nature, diamond has both high thermal conductivity and low thermal expansion, and it has unique advantages as a thermal conductivity enhancement material. However, the diamond is generally composited with the copper wick by coating diamond film, which leads to a low diamond content and a limited improvement of thermal conductivity.

SUMMARY

In view of the drawbacks in the prior art, an object of the present invention is to provide a composite VC heat sink containing a copper/diamond composite wick structure and a method for preparing the same. The composite VC heat sink is internally provided with the copper/diamond composite wick structure with proper pore structure, excellent thermal conductivity, wide heat dissipation area and good hydrophilicity and internally or externally provided with a copper/diamond composite plate with high thermal conductivity, so that the heat dissipation performance is maximized under the cooperation of structure and materials, making the composite VC heat sink more suitable for heat dissipation of new-generation high-power electronic devices.

To achieve the above object, the present invention adopts the following technical solutions:

The present invention provides a composite VC heat sink containing a copper/diamond composite wick structure. The VC heat sink includes a lower shell plate, the lower shell plate is provided with a recess at a center position of an inner surface and provided with a boss with a same plane size as the recess at a center position of an outer surface, and a surface of the boss or a surface of the recess is provided with a copper/diamond composite plate. When the surface of the boss is provided with the copper/diamond composite plate, the surface of the recess is directly provided with the copper/diamond composite wick structure. When the surface of the recess is provided with the copper/diamond composite plate, the copper/diamond composite wick structure is disposed on a surface of the copper/diamond composite plate. The copper/diamond composite wick structure has a three-dimensional porous structure and uses a copper/diamond sintered body as a matrix, a surface of the matrix is provided with a diamond layer, and a surface of the diamond layer is provided with a metal hydrophilic layer.

During the actual operation, the center position of the lower shell plate is provided with the boss whose size is matched with that of a chip, and correspondingly, the center of the inner surface of the lower shell plate is provided with the recess. The recess has a size corresponding to that of the boss. The wick in the recess of the lower shell plate is consistent with the chip in a vertical direction, which is the place with the largest heat flux density. Therefore, in the present invention, the copper/diamond composite wick structure with proper pore structure, excellent thermal conductivity, wide heat dissipation area and good hydrophilicity is disposed in the recess, which can greatly improve the heat dissipation performance of the entire VC heat sink. The copper/diamond composite plate is further disposed on the outer side of the boss or on the inner side of the recess, which can further improve the heat dissipation performance.

In the present invention, the inner surface of the lower shell plate refers to the surface that is mated with the upper shell plate to form a cavity.

In a preferred solution, the copper/diamond composite plate has a same plane size as that of the boss and the recess, the copper/diamond composite plate has a thickness of 1 mm-2 mm, and a mass fraction of diamond in the copper/diamond composite plate is 10%-70%, preferably 30%-50%.

In the present invention, the copper/diamond composite plate is a dense material.

In a preferred solution, the copper/diamond composite wick structure has a porosity of 40%-80%, preferably 50%-75%.

The inventors have found that by controlling the porosity of the copper/diamond composite wick structure within the above range, the porous material has plenty of internal pores and communication channels, and proper pore size, which is conducive to the flow of a working fluid and improves the heat dissipation performance of a VC plate.

In a preferred solution, a volume fraction of the copper/diamond sintered body in the copper/diamond composite wick structure is 70 vol %-90 vol %; a thickness of the diamond layer is 10 µm-100 µm; and a thickness of the metal hydrophilic layer is 0.5 µm-5 µm.

In a preferred solution, a metal of the metal hydrophilic layer is selected from one or more of chromium, titanium, molybdenum, copper, tungsten, nickel and cobalt.

In a preferred solution, a mass fraction of diamond in the copper/diamond sintered body is 10%-90%, preferably 35%-60%.

In a preferred solution, the inner surface of the lower shell plate is provided with a plurality of support columns at uniform intervals along a width direction, the center of the inner surface of the lower shell plate is provided with the recess, a capillary wick A is uniformly distributed in a channel formed between any two support columns, and the capillary wick A is selected from one or more of a wire mesh metal, a metal powder sintered body, a metal fiber sintered body, a foamed metal and a copper/diamond sintered body, preferably a copper/diamond sintered body.

In a preferred solution, the VC heat sink further includes an upper shell plate, the upper shell plate and the lower shell plate are welded to form a cavity inside, a capillary wick B is uniformly distributed in the upper shell plate, the capillary wick B is selected from one or more of a wire mesh metal, a metal powder sintered body, a metal fiber sintered body and a foamed metal, and the cavity contains a working fluid therein.

In a preferred solution, a preparation process of the copper/diamond sintered body includes: depositing a first transition layer on diamond particles, then plating copper on surfaces of the diamond particles containing the first transition layer to obtain diamond particles containing a copper coating, then mixing the diamond particles containing the copper coating with copper powder to obtain mixed powder, loosely packing the mixed powder into a graphite mold, and carrying out sintering to obtain the copper/diamond sintered body.

Further preferably, a material of the first transition layer is selected from one of or a composite of more of nickel, niobium, tantalum, titanium, cobalt, tungsten, molybdenum and chromium, and the transition layer has a thickness of 0.5 µm-30 µm.

In the present invention, as long as the first transition layer has a satisfactory thickness and good binding property, the preparation method for the first transition layer is not limited, and for example, may be one of electroplating, electroless plating, evaporation, magnetron sputtering, chemical vapor deposition and physical vapor deposition in the prior art.

Still further preferably, the first transition layer is obtained by magnetron sputtering with a power of 100 W-300 W for 20 min-90 min.

Further preferably, the copper plating on the surfaces of the diamond particles is deposited by magnetron sputtering with a copper target as the raw material with a power of 100 W-300 W for 20 min-120 min.

Further preferably, a thickness of the copper coating layer is 2 µm-30 µm, preferably 2 µm-9 µm.

In the preparation process of the copper/diamond sintered body, the thickness of the copper coating needs to be controlled to 2 µm-30 µm by controlling deposition parameters. If the copper coating is too thin, it will be difficult to exert its binding effect, the diamond particles will be easily separated from the copper in the sintering process, and the overall mechanical strength of the capillary wick will be too low. If the copper coating is too thick, it will increase the content of low-thermal-conductivity metal materials around the diamond, which is equivalent to reducing the diamond content, thereby reducing the overall thermal conductivity.

Further preferably, the copper powder has a particle size of 40 µm-150 µm, and the diamond particles have a particle size of 75 µm-500 µm.

In the present invention, by controlling the particle sizes of the copper powder and the diamond particles within the above ranges, the porosity of the present invention can be effectively controlled in combination with the proportion of the copper and the copper coating in the diamond.

Still further preferably, the copper powder has a particle size of 60 µm-150 µm, and the diamond particles have a particle size of 150 µm-500 µm.

In the present invention, the copper powder is selected from one or more of gas atomized copper powder, mechanically pulverized copper powder and water atomized copper powder.

Further preferably, a mass fraction of the diamond particles containing the copper coating in the mixed powder is 10%-100%, preferably 20%-70%, further preferably 40%-50%.

In the present invention, it is very important to pack the powder loosely in the graphite mold and to carry out solid-phase sintering without positive pressure, so that a loose three-dimensional porous copper/diamond sintered body can be obtained due to gaps between the particles.

Further preferably, the sintering is carried out in a vacuum atmosphere or a reducing atmosphere at a temperature of 700° C.-1000° C., preferably 800° C.-950° C., for 30 min-90 min.

Still further preferably, the temperature raising process of the sintering is as follows: the temperature is first raised to 700° C.-750° C. at a rate of 4° C.-12° C./min, preferably 5° C.-10° C./min, then raised to 800° C.-950° C. at a rate of 1° C.-5° C./min, preferably 2° C.-4° C./min, and maintained for 30 min-90 min.

The inventors have found that due to the difference in thermal expansion coefficient between the diamond and the copper, when they are co-sintered without adding other metals, a too high heating rate will lead to peeling at the interface, and the copper will easily peel off from the diamond. However, according to the above temperature raising procedure, the copper can bind to the diamond.

In a preferred solution, a preparation process of the copper/diamond composite wick structure includes: disposing a second transition layer on a surface of the copper/diamond sintered body first, then growing nano-diamond seed crystals on the copper/diamond sintered body containing the second transition layer to obtain a copper/diamond sintered body with nanocrystalline diamond particles adsorbed on the surface, and then sequentially depositing the diamond layer and the metal hydrophilic layer to obtain the copper/diamond composite wick structure.

In the present invention, a material of the second transition layer is selected from one of or a composite of more of nickel, niobium, tantalum, titanium, cobalt, tungsten, molybdenum and chromium, and the transition layer has a thickness of 0.1 µm-10 µm.

In the present invention, as long as the second transition layer has a satisfactory thickness and good binding property, the preparation method for the second transition layer is not limited, and for example, may be one of electroplating, electroless plating, evaporation, magnetron sputtering, chemical vapor deposition and physical vapor deposition in the prior art.

In a preferred solution, a process of growing the nano-diamond seed crystals on the copper/diamond sintered body containing the second transition layer includes: placing the copper/diamond sintered body containing the second transition layer in a suspension containing the nanocrystalline diamond particles, heating the suspension to boiling, and carrying out ultrasonic treatment and drying to obtain the copper/diamond sintered body with the nanocrystalline diamond particles adsorbed on the surface.

Further preferably, in the suspension containing the nanocrystalline diamond particles, a mass fraction of the diamond mixed particles is 0.01%-0.05%, and the nanocrystalline diamond particles contained have a particle size of 5 nm-30 nm and a purity of ≥97%.

Further preferably, the ultrasonic treatment is carried out for 5 min-30 min. After the completion of the ultrasonic treatment, a copper/diamond sintered skeleton containing the second transition layer is taken out, rinsed with deionized water and/or anhydrous ethanol, and then dried.

In a preferred solution, a process of depositing the diamond layer includes: placing the copper/diamond sintered body with the nanocrystalline diamond particles adsorbed on the surface into a chemical vapor deposition furnace, and carrying out deposition by using $CH_4$ as a carbon-containing gas and $H_2$ as a diluent gas while controlling the carbon-containing gas to account for 0.5%-10.0% of total gas mass flow in the furnace. The deposition is carried out at a temperature of 600° C.-1000° C. under a pressure of $10^3$ Pa-$10^4$ Pa for 12 h-16 h.

In a preferred solution, a process of depositing the metal hydrophilic layer includes: placing the copper/diamond sintered body with diamond deposited on the surface into a physical vapor deposition chamber, and depositing a metal by magnetron sputtering with a power of 100 W-300 W for 20 min-120 min. The metal is selected from one or more of chromium, titanium, molybdenum, copper, tungsten, nickel and cobalt.

The present invention provides a method for preparing a composite VC heat sink containing a copper/diamond composite wick structure, including the following steps: placing a capillary wick B in an upper shell plate, carrying out sintering to fix the capillary wick B onto the upper shell plate, then diffusion-welding a copper/diamond composite plate to a recess of a lower shell plate, then placing a capillary wick A and a copper/diamond composite wick structure into an upper mold of a sintering and fixing the lower shell plate into a lower mold of the sintering and fixing the upper mold while ensuring that the capillary wick A is uniformly distributed at a corresponding position in a channel formed between any two support columns of the lower shell plate and the copper/diamond composite wick structure is located at a position corresponding to the recess at a center of an inner surface of the lower shell plate, and locking and fixing the upper mold and the lower mold to obtain the sintering and fixing mold; placing the sintering and fixing mold in a vacuum atmosphere or a reducing atmosphere, carrying out sintering at 750° C.-950° C. to fix the capillary wick A and the copper/diamond composite wick onto the lower shell plate, and making the upper shell plate and the lower shell plate to be mated, edge-sealed and welded to obtain a heat sink plate; then welding a liquid filling tube, injecting a working fluid, which accounts for 5%-80% by volume of a cavity, and sealing the liquid filling tube by argon arc welding to obtain a welding-sealed heat sink plate; and carrying out machining and antioxidation treatment on the heat sink plate to obtain the composite VC heat sink.

In a preferred solution, the antioxidation treatment is to soak the heat sink plate in an antioxidant for 90 s-180 s to generate an antioxidation film on the surface.

In a preferred solution, the capillary wick B is selected from one or more of a wire mesh metal, a metal powder sintered body, a metal fiber sintered body and a foamed metal.

In a preferred solution, the capillary wick A is selected from one or more of a wire mesh metal, a metal powder sintered body, a metal fiber sintered body, a foamed metal and a copper/diamond sintered body, preferably a copper/diamond sintered body.

The present invention provides a method for preparing the composite VC heat sink containing the copper/diamond composite wick structure, including the following steps: placing a capillary wick B in an upper shell plate, carrying out sintering to fix the capillary wick B onto the upper shell plate, then placing a capillary wick A and a copper/diamond composite wick structure into an upper mold of a sintering, placing a lower shell plate into a lower mold of the sintering and fixing the upper mold while ensuring that the capillary wick A is uniformly distributed at a corresponding position in a channel formed between any two support columns of the lower shell plate and the copper/diamond composite wick structure is located at a position corresponding to a recess at a center of an inner surface of the lower shell plate, and obtaining the sintering and fixing mold; placing the sintering and fixing mold in a vacuum atmosphere or a reducing atmosphere, carrying out sintering at 750° C.-950° C. to fix the capillary wick A and the copper/diamond composite wick onto the lower shell plate, and making the upper shell plate and the lower shell plate to be mated, edge-sealed and welded to obtain a heat sink plate; then welding a liquid filling tube, injecting a working fluid, which accounts for 5%-80% by volume of a cavity, and sealing the liquid filling tube by argon arc welding to obtain a welding-sealed heat sink plate; and carrying out machining and antioxidation treatment on the heat sink plate, and then diffusion-welding a copper/diamond composite plate to a boss on an outer surface of the lower shell plate to obtain the composite VC heat sink.

In a preferred solution, the antioxidation treatment is to soak the heat sink plate in an antioxidant for 90 s-180 s to generate an antioxidation film on the surface.

In a preferred solution, the capillary wick B is selected from one or more of a wire mesh metal, a metal powder sintered body, a metal fiber sintered body and a foamed metal.

In a preferred solution, the capillary wick A is selected from one or more of a wire mesh metal, a metal powder sintered body, a metal fiber sintered body, a foamed metal and a copper/diamond sintered body, preferably a copper/diamond sintered body.

BENEFICIAL EFFECTS

At the present stage, the capillary wicks used by the VC heat sink are mostly sintered metal, woven wire mesh, microchanneled wicks. The wicks are mainly made of copper, aluminum and iron. Due to the low intrinsic thermal conductivity, such metal material wicks generate a large thermal resistance during the heat transfer process of the VC heat sink, which restricts the improvement of the heat dissipation performance of the VC. In the present invention, a copper/diamond composite skeleton is prepared and used as the capillary wick in the VC device, based on the extremely high intrinsic thermal conductivity of diamond (1800 w/mk-2000 w/mk). By compositing the copper diamond/sintered skeleton containing the diamond particles with the three-dimensional connective diamond film, the high-thermal-conductivity diamond zero-dimensional particle configuration is integrated with the three-dimensional diamond film configuration, which not only exerts the "high-speed thermal conduction channel effect" of the continuous conduction of the three-dimensional diamond film, but also increases the diamond content in the heat radiator due to the addition of the diamond particles. Compared with the traditional sintered copper powder capillary wick, the novel wick has smaller overall thermal resistance, which is conductive to improving the overall heat transfer performance of the VC device. By plating the hydrophilic layer, the wettability of the sintered diamond/copper porous heat radiator by the working fluid water is improved, which thereby solves the limitation in the application of the diamond composite material to capillary wicks due to the hydrophobicity of the carbon material, and provides a new solution for the application of the high-thermal-conductivity carbon material and the composite material thereof to the field of phase-change heat transfer devices.

In addition, in the present invention, the center of the lower shell plate is provided with the recess, and the wick in the recess of the lower shell plate is consistent with the chip in the vertical direction, which is the place with the largest heat flux density. Therefore, in the present invention, the copper/diamond composite wick structure with proper pore structure, excellent thermal conductivity, wide heat dissipation area and good hydrophilicity is disposed in the recess, which can greatly improve the heat dissipation performance of the entire VC heat sink. In other places, ordinary wicks may be selected according to the application, which thereby saves the cost on the premise of ensuring the heat dissipation performance. As a result, the present invention has very high application value.

In the present invention, the position corresponding to the recess on the outer surface of the lower shell plate is provided with the boss, and the copper/diamond composite plate is further disposed on the boss or in the recess, which can further improve the heat dissipation performance.

Based on the above, the composite VC heat sink provided by the present invention is internally provided with the copper/diamond composite wick structure with proper pore structure, excellent thermal conductivity, wide heat dissipation area and good hydrophilicity and internally or externally provided with a copper/diamond composite material with high thermal conductivity, so that the heat dissipation performance is maximized under the cooperation of structure and materials, making the composite VC heat sink more suitable for heat dissipation of new-generation high-power electronic devices.

DETAILED DESCRIPTION OF THE EMBODIMENTS

Embodiment 1

Preparation of Copper/Diamond Sintered Skeleton

Figure 1:
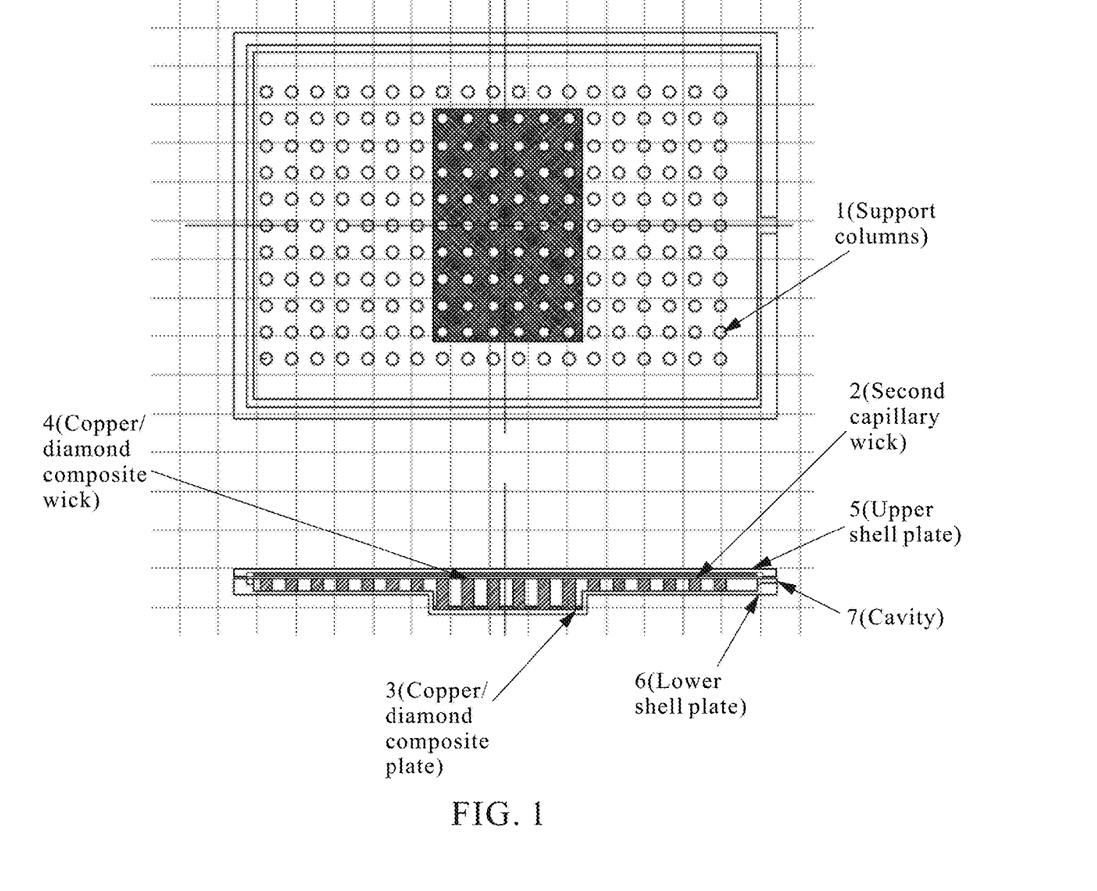
FIG. 1 is a schematic diagram of a lower shell plate whose recess is provided with a copper/diamond composite plate on an inner side according to the present invention.
Figure 2:
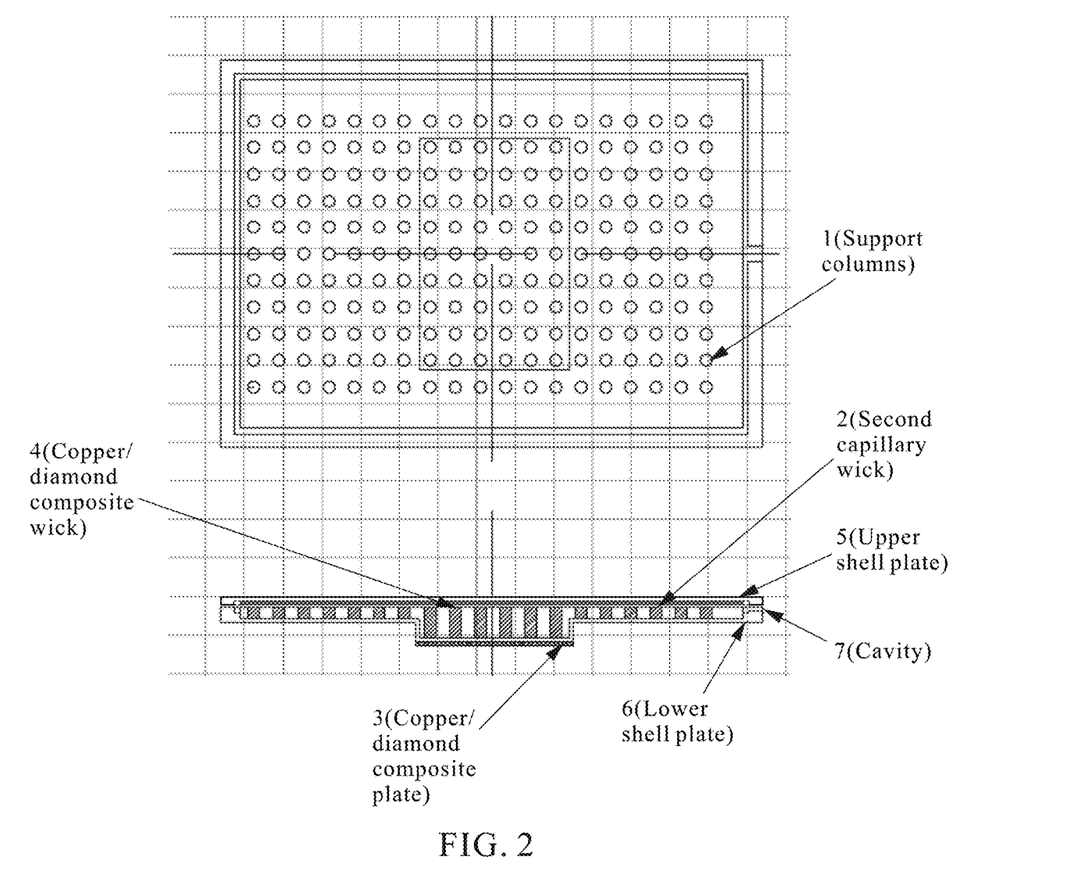
FIG. 2 is a schematic diagram of a lower shell plate whose boss is provided with a copper/diamond composite plate on an outer side according to the present invention.

A Cr transition layer was deposited on diamond particles having a particle size of 150 μm (100 mesh) by magnetron sputtering with a power of 200 W for 20 min to obtain diamond particles containing the Cr transition layer having a thickness of 2 μm, and then copper was plated on the surfaces of the diamond particles containing the Cr transition layer. The specific copper plating process was as follows: magnetron sputtering was carried out with a power of 200 W to obtain a copper coating having a thickness of 2 μm, then the diamond particles containing the copper coating were mixed with copper powder having a particle size of 150 μm in a mass ratio of 40:60 to obtain mixed powder, and the mixed powder was loosely packed in a graphite mold and sintered in a hydrogen atmosphere. During the sintering, the temperature was first raised to 750° C. at a rate of 5° C./min, then raised to 900° C. at a rate of 3.3° C./min, and maintained for 60 min, and air cooling was carried out to obtain a copper/diamond sintered body having a porosity of 56%, as the copper/diamond sintered skeleton.

Preparation of Copper/Diamond Composite Wick Structure

Growth of Seed Crystals

The copper/diamond sintered body was ultrasonically cleaned with acetone ($CH_3COCH_3$), anhydrous ethanol ($C_2H_5OH$), and deionized water respectively for 10 min. Then, a W transition layer, having a thickness of 100 nm, was sputtered on the surface of the copper/diamond sintered body by vacuum evaporation. Then, a copper substrate was placed in a nano-diamond suspension, and seed crystals were grown for 30 min by ultrasound to enhance the nucleation. Finally, the copper/diamond sintered body with the seed crystals grown on the surface was ultrasonically rinsed with deionized water for 10 min, and dried for later use.

Deposition of Diamond Layer

The copper/diamond sintered body with the seed crystals grown on the surface was placed in a chemical vapor deposition chamber, and three-dimensional continuous network diamond was deposited by hot-wire CVD. The hot wire used was a φ0.5 mm straight tungsten wire, which completely covered the substrate. Then, the pretreated substrate was placed into a chamber of HFCVD equipment, and the distance between the hot wire and the substrate was adjusted (to 8 mm). After the completion of the installation, a door was closed, and the chamber was vacuumized. Then, hydrogen and methane were introduced according to a concentration ratio of gas sources set in the experiment. After the reactive gas sources were uniformly mixed, a suction valve was closed, and a micrometering valve was adjusted to adjust the pressure in the chamber to a set pressure. Then, the power was turned on to adjust the current so as to heat the hot wire to a set temperature, and at the same time, the pressure in the deposition chamber was observed. After the completion of the deposition, the temperature of the deposition chamber was reduced by adjusting the magnitude of the current. At this time, $CH_4$ needed to be turned off, only $H_2$ was used to etch a graphite phase on the surface of the diamond. Deposition parameters used in this example were: the gas ratio $H_2:CH_4$ was 98 sccm:2.0 sccm, and the deposition time was 14 h. The deposition pressure was 3 kPa, and the deposition temperature was 850° C. The diamond layer had a thickness of 10 μm-30 μm.

The copper/diamond sintered body with the three-dimensional network diamond grown on the surface was placed into a physical vapor deposition chamber, and a metal hydrophilic layer was deposited by magnetron sputtering with Cu as the target material with a power of 150 W for 20 min to obtain the Cu metal hydrophilic layer having a thickness of 2 μm.

The copper/diamond composite wick structure was obtained.

Preparation of VC Heat Sink

An upper shell plate with a size of 140 mm×100 mm×1 mm was obtained first, and then a lower shell plate with an external size of 140 mm×100 mm×5 mm was obtained. A recess and cylindrical support columns were machined at the lower shell plate. The recess had a size of 40 mm×60 mm×3 mm. The support columns were uniformly distributed. The support columns on the surface of the lower shell plate had a size of φ2 mm×2 mm, and the support columns on the surface of the recess had a size of φ2 mm×5 m, such that the upper surface of the support column was flush with the lower shell plate. A woven copper wire mesh structure was used as a capillary wick B. The capillary wick B was placed in the upper shell plate and sintered such that the capillary wick B was fixed to the upper shell plate. Then a copper/diamond composite plate, having a size of 40 mm×60 mm×1 mm, was placed into the recess. A mass fraction of copper in the copper/diamond composite plate was 60%. The copper/diamond sintered body prepared in this embodiment was used as a capillary wick A. Then, the capillary wick A and the copper/diamond composite wick structure were placed into an upper mold of a sintering and fixing mold, and the lower shell plate was fixed into a lower mold while ensuring that the capillary wick A was uniformly distributed at a corresponding position in a channel formed between any two support columns of the lower shell plate and the copper/diamond composite wick structure was located at a position corresponding to the recess at the center. The upper mold and the lower mold were locked and fixed to obtain the sintering and fixing mold. The sintering and fixing mold was placed in an Ar atmosphere, sintering was carried out at 850° C. to fix the capillary wick A onto the lower shell plate, and the upper shell plate and the lower shell plate were mated, edge-sealed and welded to obtain a heat sink plate. Then a liquid filling tube was welded, a working fluid, which accounted for 40% by volume of the cavity was injected, and the liquid filling tube was sealed by argon arc welding to obtain a welding-sealed heat sink plate. Finally, machining and antioxidation treatment were carried out on the heat sink plate to obtain the VC heat sink. The antioxidation treatment was to soak the heat sink plate in an antioxidant for 90 s to generate an antioxidation film on the surface. The antioxidant was a copper anti-tarnish passivator, purchased from Wenzhou Aoyang Technology Co., Ltd. When the VC heat sink was tested at a heating power of 400 W, the maximum temperature difference was only 8.4° C., and the equivalent thermal resistance was 0.071° C./W. The VC heat sink had excellent temperature uniformity and heat transfer performance.

Embodiment 2

Preparation of Copper/Diamond Sintered Body

A Cr transition layer was deposited on diamond particles having a particle size of 250 μm (60 mesh) by magnetron sputtering with a power of 200 W for 90 min to obtain diamond particles containing the Cr transition layer having a thickness of 9 μm, and then copper was plated on the surfaces of the diamond particles containing the Cr transition layer. The specific copper plating process was as follows: magnetron sputtering was carried out with a power of 200 W for 90 min to obtain a copper coating having a thickness of 9 μm, then the diamond particles containing the copper coating were mixed with copper powder having a particle size of 150 μm in a mass ratio of 50:50 to obtain mixed powder, and the mixed powder was loosely packed in a graphite mold and sintered in a hydrogen atmosphere. During the sintering, the temperature was first raised to 750° C. at a rate of 300° C./h (5° C./min), then raised to 850° C. at a rate of 200° C./h (3.3° C./min), and maintained for 90 min, and air cooling was carried out to obtain the copper/diamond sintered body having a porosity of 60%.

Preparation of Copper/Diamond Composite Wick Structure

Growth of Seed Crystals

The copper/diamond sintered body was ultrasonically cleaned with acetone ($CH_3COCH_3$), anhydrous ethanol ($C_2H_5OH$), and deionized water respectively for 10 min. Then, a Cr transition layer, having a thickness of 100 nm, was sputtered on the surface of the copper/diamond sintered body by vacuum evaporation. Then, a copper substrate was placed in a nano-diamond suspension, and seed crystals were grown for 30 min by ultrasound to enhance the nucleation. Finally, the copper/diamond sintered body with the seed crystals grown on the surface was ultrasonically rinsed with deionized water for 10 min, and dried for later use.

Deposition of Diamond Layer

The copper/diamond sintered body with the seed crystals grown on the surface was placed in a chemical vapor deposition chamber, and three-dimensional continuous network diamond was deposited by hot-wire CVD. The hot wire used was a φ0.5 mm straight tungsten wire, which completely covered the substrate. Then, the pretreated substrate was placed into a chamber of HFCVD equipment, and the distance between the hot wire and the substrate was adjusted (to 8 mm). After the completion of the installation, a door was closed, and the chamber was vacuumized. Then, hydrogen and methane were introduced according to a concentration ratio of gas sources set in the experiment. After the reactive gas sources were uniformly mixed, a suction valve was closed, and a micrometering valve was adjusted to adjust the pressure in the chamber to a set pressure. Then, the power was turned on to adjust the current so as to heat the hot wire to a set temperature, and at the same time, the pressure in the deposition chamber was observed. After the completion of the deposition, the temperature of the deposition chamber was reduced by adjusting the magnitude of the current. At this time, $CH_4$ needed to be turned off, only $H_2$ was used to etch a graphite phase on the surface of the diamond. Deposition parameters used in this example were: the gas ratio $H_2:CH_4$ was 98 sccm:2.0 sccm, and the deposition time was 14 h. The deposition pressure was 3 kPa, and the deposition temperature was 850° C. The diamond layer had a thickness of 10 μm-30 μm.

Deposition of Hydrophilic Layer

The copper/diamond sintered body with the three-dimensional network diamond grown on the surface was placed into a physical vapor deposition chamber, and a metal hydrophilic layer was deposited by magnetron sputtering with Cu as the target material with a power of 150 W for 90 min to obtain the Cu metal hydrophilic layer having a thickness of 9 μm. The copper/diamond composite wick structure was obtained.

Preparation of VC Heat Sink

An upper shell plate with a size of 140 mm×100 mm×1 mm was obtained first, and then a lower shell plate with an external size of 140 mm×100 mm×5 mm was obtained. A recess was machined at the lower shell plate. The recess had a size of 40 mm×60 mm×2 mm. Cylindrical support columns were machined on the surfaces of the lower shell plate and the recess. The support columns were uniformly distributed. The support columns on the surface of the lower shell plate had a size of φ2 mm×2 mm, and the support columns on the surface of the recess had a size of φ2 mm×4 m, such that the upper surface of the support column was flush with the lower shell plate. A woven copper wire mesh structure was used as a capillary wick B. The capillary wick B was placed in the upper shell plate and sintered such that the capillary wick B was fixed to the upper shell plate. The copper/diamond sintered skeleton prepared in this embodiment was used as a capillary wick A. Then, the capillary wick A and the copper/diamond composite wick structure were placed into an upper mold of a sintering and fixing mold, and the lower shell plate was fixed into a lower mold while ensuring that the capillary wick A was uniformly distributed at a corresponding position in a channel formed between any two support columns of the lower shell plate and the copper/diamond composite wick structure was located at a position corresponding to the recess at the center. The upper mold and the lower mold were locked and fixed to obtain the sintering and fixing mold. The sintering and fixing mold was placed in an Ar atmosphere, sintering was carried out at 850° C. to fix the capillary wick A onto the lower shell plate, and the upper shell plate and the lower shell plate were mated, edge-sealed and welded to obtain a heat sink plate. Then a liquid filling tube was welded, a working fluid, which accounted for 40% by volume of the cavity was injected, and the liquid filling tube was sealed by argon arc welding to obtain a welding-sealed heat sink plate. Finally, the boss was machined on the heat sink plate, and a copper/diamond composite plate was welded to an outer side of the boss. A mass fraction of copper in the copper/diamond composite plate was 60%. The copper/diamond composite plate had a size of 40 mm×60 mm×1 mm. Then antioxidation treatment was carried out to obtain the VC heat sink. The antioxidation treatment was to soak the heat sink plate in an antioxidant for 90 s to generate an antioxidation film on the surface. The antioxidant was a copper anti-tarnish passivator, purchased from Wenzhou Aoyang Technology Co., Ltd. When the VC heat sink was tested at a heating power of 400 W, the maximum temperature difference was only 10.5° C., and the equivalent thermal resistance was 0.067° C./W. The VC heat sink had excellent temperature uniformity and heat transfer performance.

Comparative Example 1

Preparation conditions of comparative example 1 were almost the same as those in comparative example 1, except that in comparative example 1, the first-stage sintering temperature was 600° C. and the second-stage sintering temperature was 750° C. Due to the too low sintering temperature, it was difficult for the porous sintered body prepared under such conditions to form a stable neck, and the powders were bound poorly with each other, so that no capillary wick with a certain mechanical strength and capable of existing stably could be obtained.

Comparative Example 2

Preparation conditions of comparative example 2 were almost the same as those in embodiment 1, except that in comparative example 2, a first-stage heating rate was 16° C./min and a second-stage heating rate was 6° C./min. The porous sintered body prepared under such conditions had local cracks and insufficient binding properties, so that no capillary wick with a certain mechanical strength and capable of existing stably could be obtained.

Comparative Example 3

Preparation conditions of comparative example 3 were almost the same as those in embodiment 1, except that during the CVD deposition of the diamond, the gas ratio $H_2:CH_4$ was 85 sccm:15 sccm and the deposition time was 14 h. The deposition pressure was 3 kPa, and the deposition temperature was 850° C. As a result, a layer of graphite, rather than the diamond, was deposited on the surface of the copper/diamond sintered body, so that no copper/diamond composite wick structure could be obtained.

Comparative Example 4

Preparation conditions of comparative example 4 were almost the same as those in embodiment 2, except that in comparative example 3, the copper-plated diamond had a particle size of 75 μm and the copper powder had a particle size of 30 μm. The porous sintered body prepared under such conditions had a porosity of only 36%. After the porous sintered body was fixed to the VC heat sink, under the heating power of 400 W, the maximum temperature difference of the VC heat sink was 12.5° C., and the equivalent thermal resistance was 0.087° C./W. This VC heat sink had poor temperature uniformity and heat transfer performance.

What is claimed is:

1. A composite VC heat sink containing a copper/diamond composite wick structure, comprising a lower shell plate, wherein
the lower shell plate is provided with a recess at a center position of an inner surface and provided with a boss with a same plane size as the recess at a center position of an outer surface,
a surface of the boss or a surface of the recess is provided with a copper/diamond composite plate; when the surface of the boss is provided with the copper/diamond composite plate, the surface of the recess is directly provided with the copper/diamond composite wick structure; and when the surface of the recess is provided with the copper/diamond composite plate, the copper/diamond composite wick structure is disposed on a surface of the copper/diamond composite plate,
the copper/diamond composite wick structure comprises a three-dimensional porous structure and uses a first copper/diamond sintered body as a matrix, and
a surface of the matrix is provided with a diamond layer, and a surface of the diamond layer is provided with a metal hydrophilic layer.

2. The composite VC heat sink containing the copper/diamond composite wick structure according to claim 1, wherein
the copper/diamond composite plate has the same plane size as the boss and the recess, a thickness of the copper/diamond composite plate is 0.5 mm-3 mm, a mass fraction of a diamond in the copper/diamond composite plate is 10%-70%,
the copper/diamond composite wick structure has a porosity of 40%-80%,
a volume fraction of the first copper/diamond sintered body in the copper/diamond composite wick structure is 70 vol-90 vol %;
a thickness of the diamond layer is 10 μm-100 μm;
a thickness of the metal hydrophilic layer is 0.5 μm-5 μm;
a metal of the metal hydrophilic layer is selected from at least one of chromium, titanium, molybdenum, copper, tungsten, nickel, and cobalt; and a mass fraction of the diamond in the first copper/diamond sintered body is 10%-90%.

3. The composite VC heat sink containing the copper/diamond composite wick structure according to claim 1, wherein the inner surface of the lower shell plate is provided with a plurality of support columns at uniform intervals along a width direction, the center position of the inner surface of the lower shell plate is provided with the recess, a first capillary wick is uniformly distributed in a channel formed between two of the plurality of support columns, and the first capillary wick is selected from at least one of a wire mesh metal, a metal powder sintered body, a metal fiber sintered body, a foamed metal, and the first copper/diamond sintered body;

the composite VC heat sink further comprises an upper shell plate, wherein the upper shell plate and the lower shell plate are welded to form a cavity inside, a second capillary wick is uniformly distributed in the upper shell plate, and the second capillary wick is selected from at least one of the wire mesh metal, the metal powder sintered body, the metal fiber sintered body, and the foamed metal, and the cavity comprises a working fluid.

4. The composite VC heat sink containing the copper/diamond composite wick structure according to claim 1, wherein a preparation process of the first copper/diamond sintered body comprises:

depositing a first transition layer on first diamond particles, plating copper on surfaces of the first diamond particles containing the first transition layer to obtain second diamond particles containing a copper coating, mixing the second diamond particles containing the copper coating with a copper powder to obtain a mixed powder, loosely packing the mixed powder into a graphite mold, and carrying out a sintering to obtain the first copper/diamond sintered body.

5. The composite VC heat sink containing the copper/diamond composite wick structure according to claim 4, wherein a material of the first transition layer is selected from at least one of nickel, niobium, tantalum, titanium, cobalt, tungsten, molybdenum, and chromium, a thickness of the first transition layer is 0.5 μm-30 μm, a thickness of the copper coating is 2 μm-30 μm, a particle size of the copper powder is 40 μm-150 μm, and a particle size of the first diamond particles is 75 μm-500 μm.

6. The composite VC heat sink containing the copper/diamond composite wick structure according to claim 4, wherein the sintering is carried out in a vacuum atmosphere or a reducing atmosphere at a temperature of 700° C.-1000° C. for 30 min-90 min.

7. The composite VC heat sink containing the copper/diamond composite wick structure according to claim 1, wherein a preparation process of the copper/diamond composite wick structure comprises:

disposing a second transition layer on a surface of the first copper/diamond sintered body, growing nano-diamond seed crystals on the first copper/diamond sintered body containing the second transition layer to obtain a second copper/diamond sintered body with nanocrystalline diamond particles adsorbed on a surface of the second copper/diamond sintered body, and sequentially depositing the diamond layer and the metal hydrophilic layer to obtain the copper/diamond composite wick structure.

8. The composite VC heat sink containing the copper/diamond composite wick structure according to claim 7, wherein a material of the second transition layer is selected from at least one of nickel, niobium, tantalum, titanium, cobalt, tungsten, molybdenum, and chromium, and a thickness of the second transition layer is 0.1 urn-10 urn;

a process of growing the nano-diamond seed crystals on the first copper/diamond sintered body containing the second transition layer comprises:

placing the first copper/diamond sintered body containing the second transition layer in a suspension containing the nanocrystalline diamond particles, heating the suspension to boiling, and carrying out an ultrasonic treatment and a drying to obtain the second copper/diamond sintered body with the nanocrystalline diamond particles adsorbed on the surface of the second copper/diamond sintered body;

wherein in the suspension containing the nanocrystalline diamond particles, a mass fraction of diamond mixed particles is 0.01%-0.05%, and a particle size of the nanocrystalline diamond particles in the suspension is 5 nm-30 nm, and the nanocrystalline diamond particles have a purity of more than or equal to 97%;

a process of depositing the diamond layer comprises:

placing the second copper/diamond sintered body with the nanocrystalline diamond particles adsorbed on the surface of the second copper/diamond sintered body into a chemical vapor deposition furnace, and carrying out a deposition by using CH4 as a carbon-containing gas and H2 as a diluent gas while controlling the carbon-containing gas to an amount of 0.5%-10.0% of a total gas mass flow in the chemical vapor deposition furnace, wherein the deposition is carried out at a temperature of 600° C.-1000° C. under a pressure of 103 Pa-104 Pa for 12 h-16 h; and a process of depositing the metal hydrophilic layer comprises:

placing the second copper/diamond sintered body with a diamond deposited on the surface of the second copper/diamond sintered body into a physical vapor deposition chamber, and depositing a metal by a magnetron sputtering with a power of 100 W-300 W for 20 min-120 min, wherein the metal is selected from at least one of chromium, titanium, molybdenum, copper, tungsten, nickel, and cobalt.

9. A method for preparing the composite VC heat sink containing the copper/diamond composite wick structure according to claim 3, comprising the following steps:

placing the second capillary wick in the upper shell plate, carrying out a sintering to fix the second capillary wick onto the upper shell plate, diffusion-welding the copper/diamond composite plate to the recess of the lower shell plate, placing the first capillary wick and the copper/diamond composite wick structure into a upper mold of the sintering, fixing the lower shell plate into a lower mold of the sintering, and fixing the upper mold while ensuring that the first capillary wick is uniformly distributed at a corresponding position in the channel formed between the two of the plurality of support columns of the lower shell plate, and the copper/diamond composite wick structure is located at a position corresponding to the recess at the center position of the inner surface of the lower shell plate, and locking and fixing the upper mold and the lower mold to obtain the a fixed mold for sintering;

placing the fixed mold in a vacuum atmosphere or a reducing atmosphere, carrying out the sintering at 750° C.-950° C. to fix the first capillary wick and the copper/diamond composite wick structure onto the lower shell plate, and making the upper shell plate and the lower shell plate to be mated, edge-sealed, and welded to obtain a heat sink plate;

welding a liquid filling tube, injecting the working fluid, wherein the working fluid accounts for 5%-80% by volume of the cavity, sealing the liquid filling tube by an argon arc welding to obtain a welding-sealed heat sink plate; and carrying out a machining and antioxidation treatment on the welding-sealed heat sink plate to obtain the composite VC heat sink.

10. A method for preparing the composite VC heat sink containing the copper/diamond composite wick structure according to claim 3, comprising the following steps:

placing the second capillary wick in the upper shell plate, carrying out a sintering to fix the second capillary wick onto the upper shell plate, placing the first capillary wick and the copper/diamond composite wick structure into an upper mold of the sintering, placing the lower shell plate into a lower mold of the sintering, and fixing the upper mold while ensuring that the first capillary wick is uniformly distributed at a corresponding position in the channel formed between the two of the plurality of support columns of the lower shell plate, and the copper/diamond composite wick structure is located at a position corresponding to the recess at the center position of the inner surface of the lower shell plate, and obtaining a fixed mold for the sintering;

placing the fixed mold in a vacuum atmosphere or a reducing atmosphere, carrying out the sintering at 750° C.-950° C. to fix the first capillary wick and the copper/diamond composite wick structure onto the lower shell plate, and making the upper shell plate and the lower shell plate to be mated, edge-sealed, and welded to obtain a heat sink plate;

welding a liquid filling tube, injecting the working fluid, wherein the working fluid accounts for 5%-80% by volume of the cavity, sealing the liquid filling tube by an argon arc welding to obtain a welding-sealed heat sink plate;

carrying out a machining and antioxidation treatment on the welding-sealed heat sink plate, and diffusion-welding the copper/diamond composite plate to the boss on the outer surface of the lower shell plate to obtain the composite VC heat sink.

\* \* \* \* \*